(12) United States Patent
Cases et al.

(10) Patent No.: US 7,533,458 B1
(45) Date of Patent: *May 19, 2009

(54) METHOD FOR REDUCING NOISE COUPLING IN HIGH SPEED DIGITAL SYSTEMS

(75) Inventors: Moises Cases, Austin, TX (US);
Bradley D. Herrman, Cary, NC (US);
Kent B. Howieson, Austin, TX (US);
Erdem Matoglu, Austin, TX (US);
Bhyrav M. Mutnury, Austin, TX (US);
Pravin S. Patel, Cary, NC (US); Nam H. Pham, Round Rock, TX (US); Caleb J. Wesley, Winston Salem, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/174,810

(22) Filed: Jul. 17, 2008

Related U.S. Application Data

(63) Continuation of application No. 11/924,416, filed on Oct. 25, 2007.

(51) Int. Cl.
*H05K 3/36* (2006.01)
(52) U.S. Cl. .............. 29/830; 29/825; 29/832; 29/846; 156/293
(58) Field of Classification Search .......... 29/825, 29/830, 832, 846, 852; 156/293
See application file for complete search history.

(56) References Cited

U.S. PATENT DOCUMENTS

| | | | | |
|---|---|---|---|---|
| 6,388,207 B1 * | 5/2002 | Figueroa et al. | ............. | 174/262 |
| 6,630,628 B2 * | 10/2003 | Devnani et al. | ............. | 174/255 |
| 7,152,319 B2 | 12/2006 | Chan et al. | | |
| 7,238,892 B2 | 7/2007 | Bois et al. | | |
| 7,378,598 B2 * | 5/2008 | Bois et al. | ................... | 174/261 |
| 2007/0095471 A1 * | 5/2007 | Ito et al. | ..................... | 156/293 |

* cited by examiner

*Primary Examiner*—C. J Arbes
(74) *Attorney, Agent, or Firm*—Cantor Colburn LLP; Cynthia Byrd

(57) ABSTRACT

Methods and systems for reducing noise coupling in high-speed digital systems. Exemplary embodiments include a method, including etching a plurality of high speed signal traces onto a core insulating layer, forming trenches on respective sides of the plurality of high speed signal traces, thereby removing insulating material adjacent to the plurality of high speed signal traces and forming pedestals having remaining insulating material, the plurality of high speed signal traces disposed on and coupled to the remaining insulating material, coupling pre-preg material on the high speed signal traces, removing the pre-preg material adjacent the trenches, thereby retaining the pre-preg material aligned with the high speed signal traces, and heating and pressing a core layer to the pre-preg layer, and heating and pressing the pre-preg layer to the core insulating layer.

3 Claims, 5 Drawing Sheets

METHOD FOR REDUCING NOISE COUPLING IN HIGH SPEED DIGITAL SYSTEMS

CROSS-REFERENCE TO RELATED APPLICATIONS

This application is a continuation of U.S. patent application Ser. No. 11/924,416, filed Oct. 25, 2007, the disclosure of which is incorporated by reference herein in its entirety.

TRADEMARKS

IBM ® is a registered trademark of International Business Machines Corporation, Armonk, N.Y., U.S.A. Other names used herein may be registered trademarks, trademarks or product names of International Business Machines Corporation or other companies.

BACKGROUND

1. Field

This invention relates to printed circuit board fabrication, and particularly to methods and systems for reducing noise coupling in high-speed digital systems.

2. Description of Background

FIG. 1 illustrates a conventional printed circuit board having a core layer 105 having a return current reference layer 106, a pre-preg layer 110 and a core insulator layer 120 having a return current reference layer 115 and a number of single layer nets 125. Cross-talk noise coupling on adjacent nets 125 (i.e., victim nets) can result in poor signal integrity in high speed system. The effects of cross-talk noise can be intensified with increased signal speeds.

Currently, many techniques have been proposed to reduce noise and cross-talk coupling, but often rely on complex digital signal processing (DSP) techniques and filtering algorithms to achieve noise isolation.

There is currently a need to detect and implement, and at the same time, achieve high noise isolation.

SUMMARY

Exemplary embodiments include a printed circuit board apparatus having reduced noise coupling, the apparatus including a core layer having an upper and lower surface, the upper and lower surface each including a copper sheet layer, a pre-preg layer having an upper surface and a lower surface, the upper surface of the pre-preg layer coupled to the lower surface of the core layer, a core insulating layer having an upper surface and a lower surface, the upper surface of the core insulating layer coupled to the lower surface of the pre-preg layer, a return current reference layer disposed on the lower surface of the core insulator layer and high-speed signal traces disposed on the upper surface of the core insulating layer, each of the high speed signal traces disposed on a pedestal defined by a section of the pre-preg layer and the core insulating layer, each pedestal being separated by an air gap disposed between adjacent pedestals.

Further exemplary embodiments include a printed circuit board fabrication method, including etching a plurality of high speed signal traces onto a core insulating layer, forming trenches on respective sides of the plurality of high speed signal traces, thereby removing insulating material adjacent to the plurality of high speed signal traces and forming pedestals having remaining insulating material, the plurality of high speed signal traces disposed on and coupled to the remaining insulating material, coupling pre-preg material on the high speed signal traces, removing the pre-preg material adjacent the trenches, thereby retaining the pre-preg material aligned with the high speed signal traces, wherein a width of a trench portion disposed in the pre-preg material is greater than a width of a trench portion disposed in the core insulating layer and heating and pressing a core layer to the pre-preg layer, and heating and pressing the pre-preg layer to the core insulating layer, wherein the plurality of high-speed signal traces disposed on an upper surface of the core insulating layer, each of the plurality of high speed signal traces disposed on a pedestal defined by a section of the pre-preg layer and the core insulating layer, each pedestal being separated by an air gap disposed between adjacent pedestals.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which cross-talk noise coupling from adjacent nets on PCBs is reduced.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
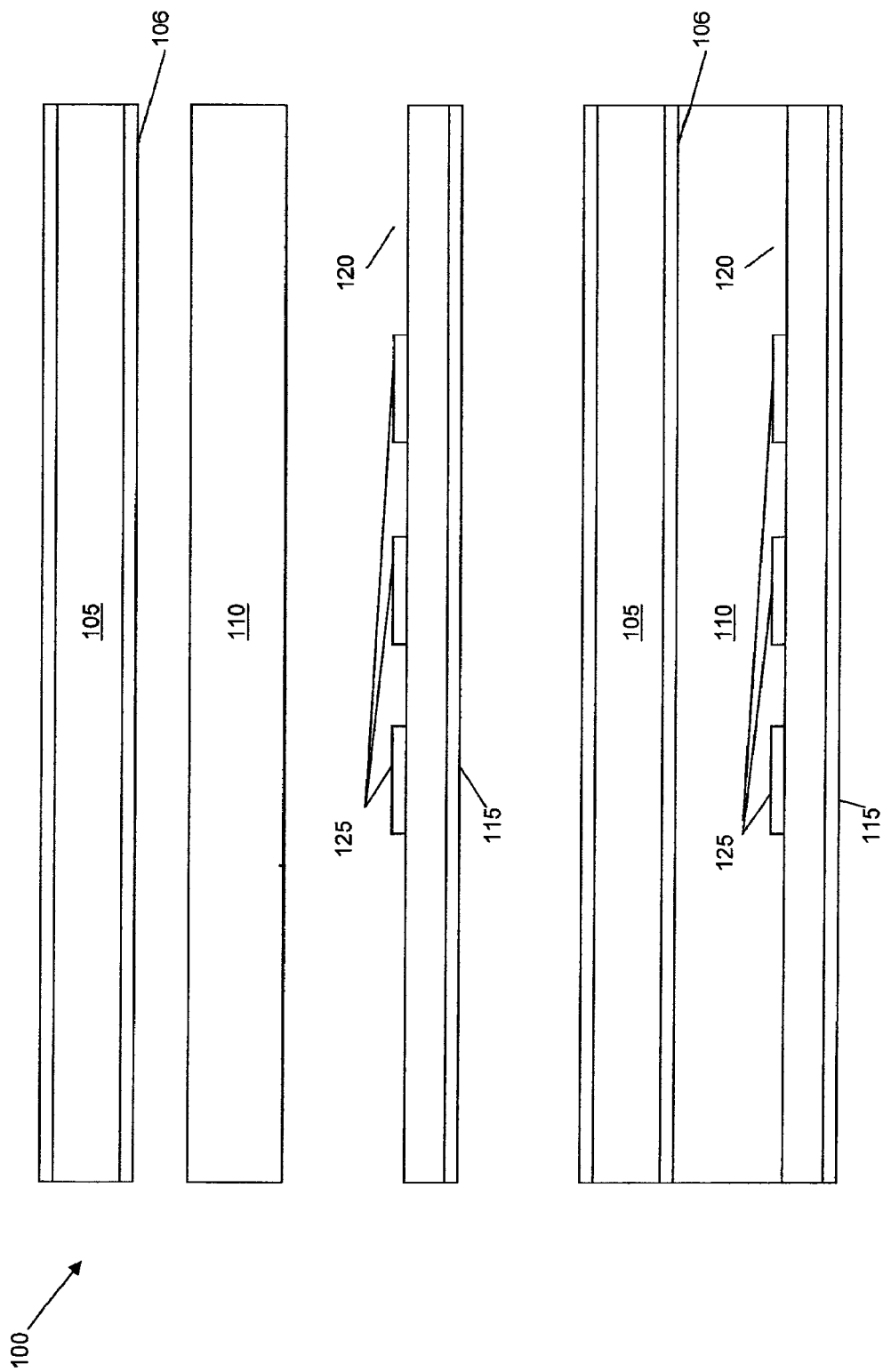
FIG. 1 illustrates a conventional printed circuit board.

The detailed description explains the preferred embodiments of the invention, together with advantages and features, by way of example with reference to the drawings.

DETAILED DESCRIPTION

In exemplary embodiments, the systems and methods described herein reduce cross-talk coupling or noise induction created by capacitive and inductive coupling. Capacitive coupling occurs due to the presence of dielectric medium. In exemplary embodiments, the systems and methods described herein include adjacent printed circuit board (PCB) stripline structures that are surrounded with air. A PCB trace on an inner layer is supported in an air cavity by a pedestal of insulating material. The pedestal is created by digging trenches in core laminate and pre-preg. In exemplary embodiments, pre-preg (pre-impregnated) refers to a layer of exemplary structures described herein, of insulation material inserted between the etched cores. In exemplary embodiments, the pre-preg can be a combination of mat, fabric, non-woven material or roving with resin, usually cured to the B-stage, ready for molding. A standard pre-preg contains more resin than is desired in the finished part; excess resin is bled off during cure. A net resin pre-preg contains the same resin content that is desired in the finished part; no resin bleed. Pre-preg containing a chemical thickening agent is called a mold-mat and those in sheet form are called sheet molding compounds.

In exemplary embodiments, the systems and methods described herein reduce cross-talk noise coupling from adjacent nets on PCBs. In exemplary embodiments, the systems and methods described herein decrease spacing between adjacent traces without any increase in noise coupling.

Capacitive coupling occurs due to presence of a dielectric medium as discussed above. The higher the value of the dielectric constant, Dk, of the dielectric medium, the stronger the capacitive coupling. In exemplary embodiment, trenches are cut and scoured out on each side of the signal traces with a laser (or any other etching mechanism, such as chemical, etc.). A pedestal of high dielectric constant material supports the trace. The thickness of core and pre-preg determine the distance of the trace from the conducting layer on other side of core. By the proximity rule, the return path is on the conducting layer(s) closest to the signal trace.

In exemplary embodiments, air is trenched in the dielectric between the adjacent side by side signal traces. Since the relative dielectric of the material between the signal and the reference layers is much greater than air, the result is a structure where the capacitance from signal trace to return path is much greater than the capacitance for signal trace to signal trace. Since the cross talk is define by coupling ratio of coupled capacitance to total capacitance, the trace can be closer in proximity with little coupling and the current will return through the reference planes and does not couple with adjacent traces.

Exemplary embodiments described herein include systems and methods for both single-ended and differential nets as now described.

Figure 2:
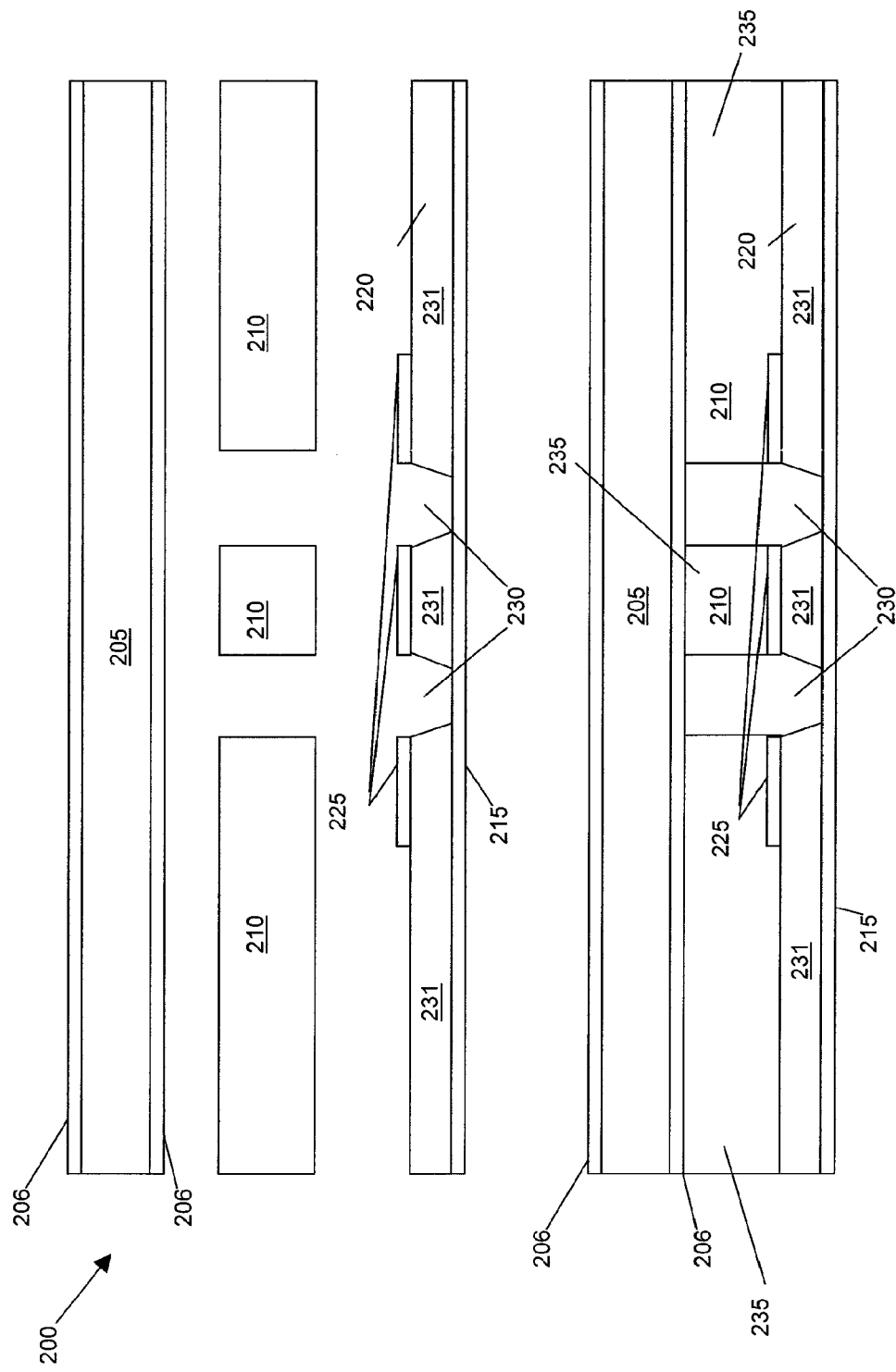
FIG. 2 illustrates a PCB apparatus that reduces cross-talk for single-ended nets in accordance with exemplary embodiments.

Turning now to the drawings in greater detail, FIG. 2 illustrates a PCB apparatus 200 that reduces cross-talk for single-ended nets. In exemplary embodiments, the apparatus 200 includes a core layer 205, a pre-preg layer 210 and a core insulating layer 220 having a return current reference layer 215 and a number of single layer nets 225. In exemplary embodiments, the core layer 205 and the core insulator layer 220 are an insulating material. In exemplary embodiments, the core layer 205 includes copper sheets 206 bonded on each surface of the core layer 205, in which the lower layer is a return current reference layer. In exemplary embodiments, an upper copper sheet bonded on an upper surface on the core insulating layer 220 is etched to create the single layer nets 225. A lower copper sheet bonded to the lower surface of the core insulating layer 220 is retained as the return current reference layer 215. In exemplary embodiments, the apparatus 200 further includes trenches 230 that have been etched into both the core insulating layer 220 and the pre-preg layer 210. In exemplary embodiments, the formation of the trenches 230 further defines distinct pedestals 235 including raised regions 231 of the core insulating layers 220, each pedestal 235 supporting a single layer net 225. As described herein, the trenches 230 are cut and scoured out on each side of the single layer nets 225 (i.e., the signal traces), thereby creating air gaps between respective pedestals 235.

Figure 3:
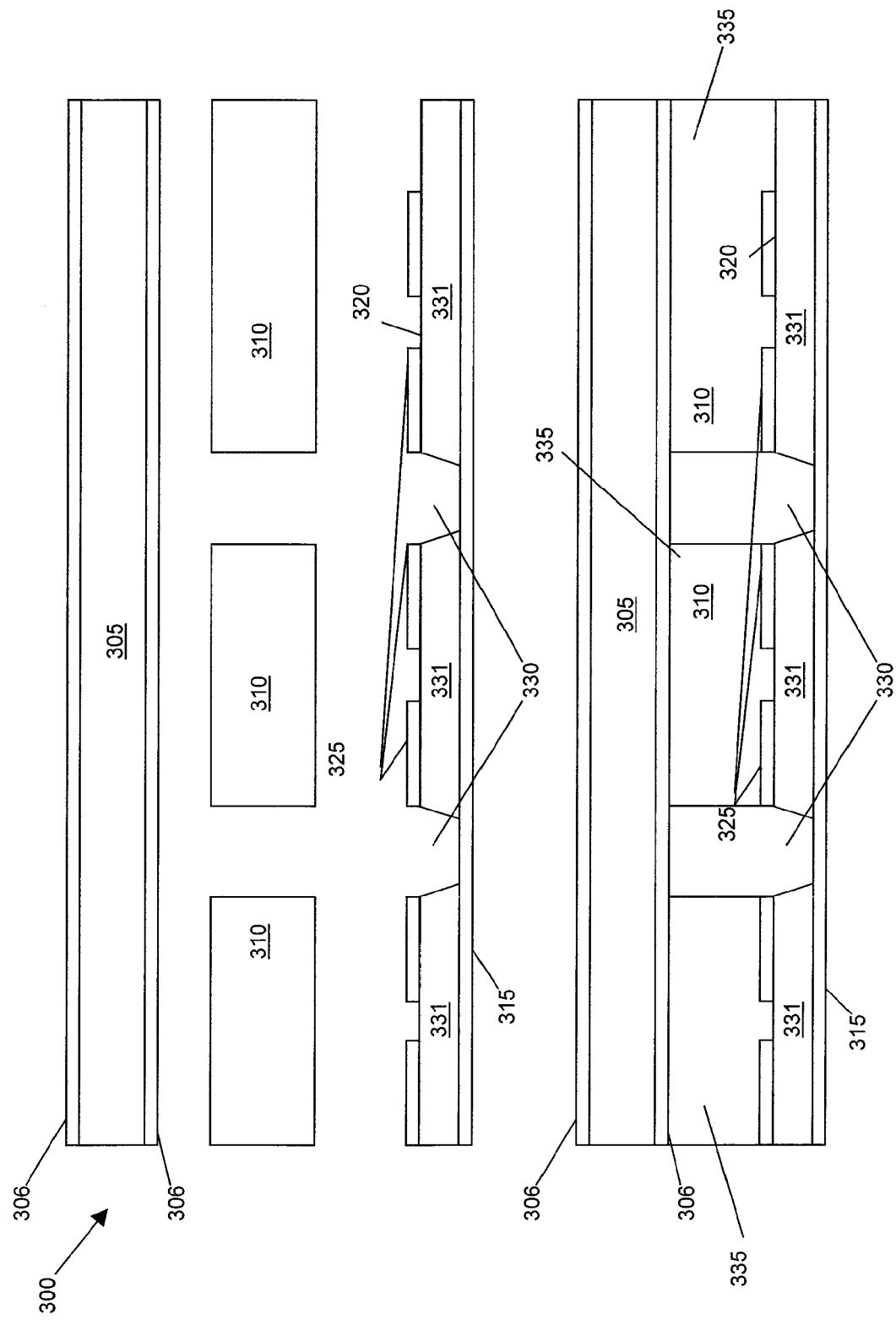
FIG. 3 illustrates a PCB apparatus that reduces cross-talk for differential nets in accordance with exemplary embodiments.

FIG. 3 illustrates a PCB apparatus 300 that reduces cross-talk for differential nets in accordance with exemplary embodiments. In exemplary embodiments, the apparatus 300 includes a core layer 305, a pre-preg layer 310 and a core insulating layer 320 having a return current reference layer 315 and a number of differential nets 325. In exemplary embodiments, the core layer 305 and the core insulator layer 320 are an insulating material. In exemplary embodiments, the core layer 305 includes copper sheets 306 bonded on each surface of the core layer 305, in which the lower layer is a return current reference layer. In exemplary embodiments, an upper copper sheet bonded on an upper surface on the core insulating layer 320 is etched to create the differential nets 325. A lower copper sheet bonded to the lower surface of the core insulating layer 320 is retained as the return current reference layer 315. In exemplary embodiments, the apparatus 300 further includes trenches 330 that have been etched into both the core insulating layer 320 and the pre-preg layer 310. In exemplary embodiments, the formation of the trenches 330 further defines distinct pedestals 335 including raised portions 331 of the core insulating layer 320, each pedestal 335 supporting a differential net 325. As described herein, the trenches 330 are cut and scoured out on each side of the single layer nets 325 (i.e., the signal traces), thereby creating air gaps between respective pedestals 335.

Figure 4:
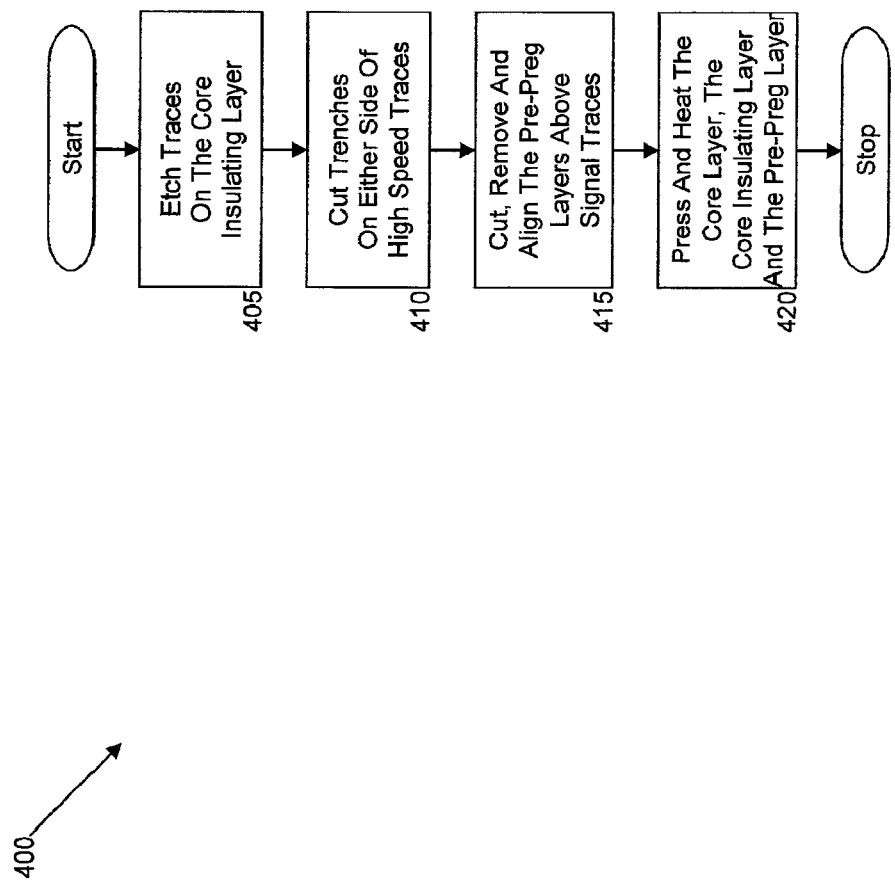
FIG. 4 illustrates a flowchart of a printed circuit board fabrication method for reducing cross talk in accordance with exemplary embodiments.

FIG. 4 illustrates a flowchart of a printed circuit board fabrication method 400 for reducing cross talk in accordance with exemplary embodiments. At block 405, traces (i.e., the single layer nets 225 or the differential nets 325) are etched onto the core insulator layers 220, 320. At block 410, the trenches 230, 330 are cut on each side the high speed signal trace so that all insulating material in the proximity of the nets 225, 325 is removed. The pedestals 235, 335 are formed from the remaining insulating material under the nets 225, 325. At block 415, sections of the pre-preg layers 210, 310 are cut, removed, and aligned above the target high speed signal trace (e.g., the nets 225, 325), which had trenches 230, 330 on each and supported by a pedestal 235, 335. In exemplary embodiments, the cut out sections are larger in the pre-preg layers 210, 310 than the core insulating layers 220, 320 to prevent the pre-preg layers 210, 310 from expanding into the trenches 230, 330 that are in formation. At block 420, the stack of core layers 205, 305, core insulating layers 220, 320 and the pre-preg layers 210, 310 are pressed and heated.

Figure 5:
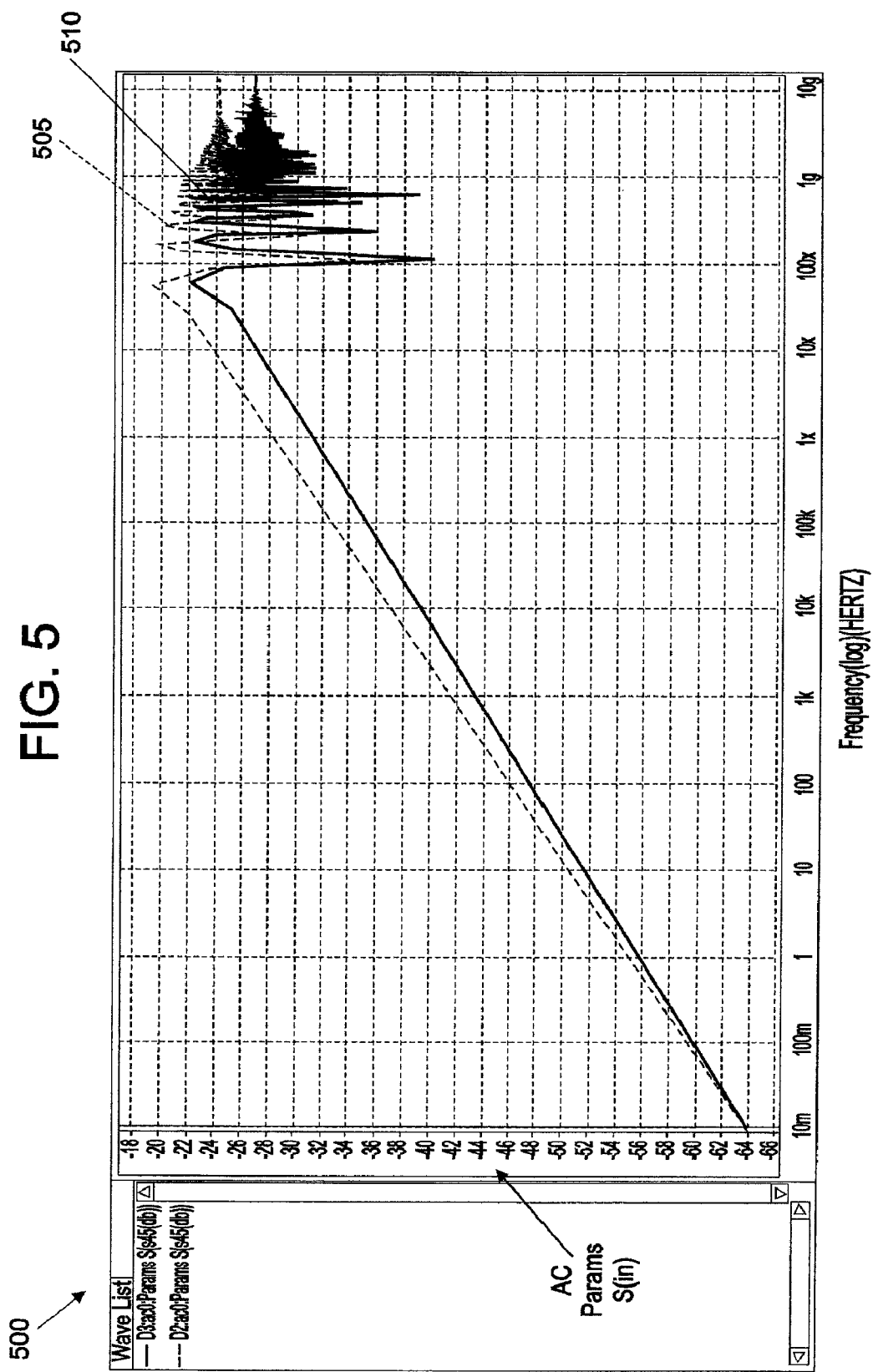
FIG. 5 illustrates a graph of noise coupling simulation results.

FIG. 5 illustrates a graph 500 of noise coupling simulation results. The graph 500 plots noise level versus frequency comparing a noise coupling plot 505 in conventional PCBs against a reduced noise coupling plot 510 of a PCB in accordance with exemplary embodiments.

The capabilities of the present invention can be implemented in software, firmware, hardware or some combination thereof As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A printed circuit board fabrication method, comprising:
   etching a plurality of high speed signal traces onto a core insulating layer;
   forming trenches on respective sides of the plurality of high speed signal traces, thereby removing insulating material adjacent to the plurality of high speed signal traces and forming raised regions having remaining insulating material, the plurality of high speed signal traces disposed on and coupled to the remaining insulating material;
   coupling pre-preg material on the high speed signal traces;
   removing the pre-preg material adjacent the trenches, thereby retaining the pre-preg material aligned with the high speed signal traces, wherein a width of a trench portion disposed in the pre-preg material is greater than a width of a trench portion disposed in the core insulating layer; and
   heating and pressing a core layer to the pre-preg layer, and heating and pressing the pre-preg layer to the core insulating layer,
   wherein the plurality of high-speed signal traces disposed on an upper surface of the core insulating layer, each of the plurality of high speed signal traces disposed on a pedestal defined by a section of the pre-preg layer and the raised regions of the core insulating layer, each pedestal being separated by an air gap disposed between adjacent pedestals.

2. The method as claimed in claim 1 wherein the plurality of high speed signal traces are single layer nets, wherein each pedestal supports a single layer net.

3. The method as claimed in claim 1 wherein the plurality of high speed signal traces are differential nets, wherein each pedestal supports a differential net pair.

* * * * *